United States Patent

Yu et al.

[11] Patent Number: 6,107,204
[45] Date of Patent: Aug. 22, 2000

[54] METHOD TO MANUFACTURE MULTIPLE DAMASCENE BY UTILIZING ETCH SELECTIVITY

[75] Inventors: Allen S. Yu, Fremont; Paul J. Steffan, Elk Grove; Thomas C. Scholer, San Jose, all of Calif.

[73] Assignee: Advanced Micro Devices, Inc., Sunnyvale, Calif.

[21] Appl. No.: 09/165,783

[22] Filed: Oct. 2, 1998

[51] Int. Cl.[7] .................................................. H01L 21/311
[52] U.S. Cl. ............................................................ 438/694
[58] Field of Search .................................... 438/618, 634, 438/638, 692, 700, 706, 624, 626, 694, 735

[56] References Cited

U.S. PATENT DOCUMENTS

| | | | |
|---|---|---|---|
| 5,741,626 | 4/1998 | Jain et al. | 430/314 |
| 5,880,018 | 3/1999 | Boeck et al. | 438/619 |
| 5,920,790 | 7/1999 | Wetzel et al. | 438/618 |
| 5,960,317 | 9/1999 | Jeong | 438/633 |

*Primary Examiner*—Benjamin L. Utech
*Assistant Examiner*—Lynette T. Umez-Eronini
*Attorney, Agent, or Firm*—H. Donald Nelson

[57] ABSTRACT

A method of manufacturing a semiconductor device having multiple layers of interconnects that are filled in a single conductive material filling step. Two layers of interlayer dielectric separated by an etch stop layer are formed over a layer including metal structures in contact with electrodes of active devices formed in and on a semiconductor substrate. A layer of photoresist is formed on a second etch stop layer formed on the upper layer of interlayer dielectric. The layer of photoresist is patterned and etched. Masking and etching processes form openings in the first and second layers of interlayer dielectric including openings to the metal structures. The openings are filled in a single conductive material filling step.

2 Claims, 6 Drawing Sheets

METHOD TO MANUFACTURE MULTIPLE DAMASCENE BY UTILIZING ETCH SELECTIVITY

BACKGROUND OF THE INVENTION

1. Field of the Invention

This invention relates generally to method of manufacturing high density, high performance semiconductor devices that have multiple layers of interconnects. More specifically, this invention relates to a method of manufacturing high density, high performance semiconductor devices that have multiple layers of interconnects that can be filled in a single conductive material filling.

2. Discussion of the Related Art

The increased demand for higher performance semiconductor devices has required the density of metallization lines to be increased and in addition has required the addition of stacked layers. These requirements have necessitated the development of novel approaches in the methods of forming interconnections that not only integrate fine geometry definition but are also conducive to subsequent CMP (chemical mechanical polishing) processing. As the interconnection line widths shrink, the challenges of etching materials using photoresist-as-mask techniques have become increasingly difficult.

Traditional methods of forming interconnection structures include the use of photoresist patterning and chemical or plasma "subtractive" etching as the primary metal-patterning technique. However, using this method, it is not possible to form a planarized layer using conventional dielectric spin-on or fill/etchback techniques for filling in the spaces between the conductive wiring. Therefore, a chemical mechanical polish (CMP) is required to form the planarized surface on which subsequent metallization structures will be built. Additional difficulties in the traditional method include the trapping of impurities or volatile materials, such as aluminum chloride, in the inter-wiring spaces, which may pose reliability risks to the device, leaving residual metal stringers, which may cause electrical shorts, residual photoresist, and poor step coverage. These problems contribute to low yields and necessitate relaxed design rules that result in low layout density.

Previous attempts to address the disadvantage of the traditional etchback methods of providing planarized interconnection structures include a single damascene technique for forming an interconnect or wire. Although the single damascene technique results in improved planarization, the technique is time consuming and requires numerous additional processing steps. In addition, an interface exists between the conductive via and conductive wire that must be dealt with elsewhere.

Another technique utilized to address the disadvantage of the traditional etchback methods is the dual damascene process. The dual damascene process is a two step sequential mask/etch process to form a two level structure such as a via connected to a metal line above the via. Current dual damascene processing technology entails depositing a triple layer sandwich consisting of thick layer of a dielectric material, an etch stop material having a high etch selectivity to the dielectric layer, and a second thick layer of a dielectric material. The two level structure is formed by masking and etching through the top layer of dielectric material and stopping on the layer of etch stop material, etching the etch stop material only, then performing a second masking and etching process with the second mask being an oversize mask. The second etch is to the dielectric material underlying the lower layer of dielectric material. The requirement to perform a second masking and etching process is time consuming and the added processes can be the source of defects in the device being manufactured.

The requirement to manufacture more complex semiconductor devices while maintaining the small size of the devices has resulted in the manufacture of devices that have multiple layers. Because of the complexity of the circuits that are integrated in the devices, it is required for different types of interconnect within layers and between layers. One type of interconnect is completely within a single layer and connects an electrode of a device with an electrode of another device on the same layer. Another type of interconnect is a via that connects an electrode of a device in one layer with an electrode of another device on another layer or with a wire in a metal layer. The via may also connect a wire in one layer with a wire in another layer.

Previous manufacturing methods require mask steps, etch steps and conductive material filling steps to form interconnect structures in each layer. The repetition of each of these steps for each layer is time consuming and has the potential for increasing the number of defects during the manufacturing process.

Therefore, what is needed is a method of manufacturing semiconductor devices having multiple layers in which multiple layers of interconnects can be filled with a conductive material in a single step.

SUMMARY OF THE INVENTION

According to the present invention, the foregoing and other objects and advantages are attained by a method of manufacturing a semiconductor device having multiple levels of interconnects which are formed during a single filling step.

In accordance with an aspect of the invention, two layers of interlayer dielectric separated by an etch stop layer are formed over a layer including metal structures in contact with electrodes of active devices formed in and on a semiconductor substrate. A first layer of photoresist is formed on a second etch stop layer formed on the upper layer of interlayer dielectric. The first layer of photoresist is patterned and etched. Masking and etching processes form openings in the first and second layers of interlayer dielectric including openings to the metal structures. The openings are filled in a single conductive material filling step.

In accordance with another aspect of the invention, a second layer of photoresist is formed on the surface of the semiconductor device after the openings have been filled with conductive material and the surface of the semiconductor device planarized. The second layer of photoresist is patterned and etched to expose portions of the surface of the planarized surface. An anisotropic etch process etches exposed portions of the conductive material. The second layer of photoresist is removed and the etched portions in the conductive material are filled with a dielectric material.

The described method provides an improved method of manufacturing a semiconductor device having multiple layers of interconnect wherein the interconnect structures can be filled in a single step. The interconnect structures can be a combination of a via and a wire or simply a wire. In addition, the interconnect structure can be a wire with a via formed to the next higher level.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1A:
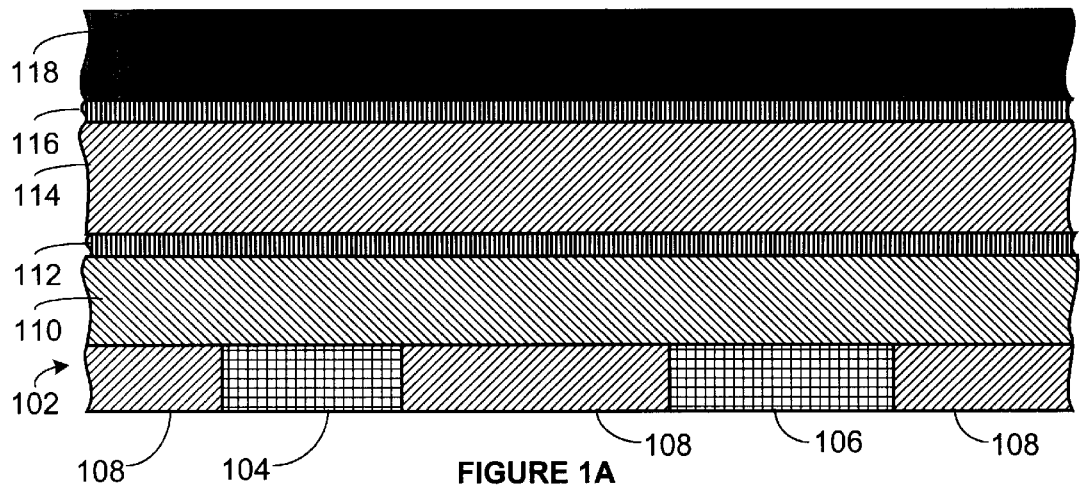
FIG. 1A shows a partially completed semiconductor device showing a substrate structure with two metal structures, two layers of interlayer dielectric separated by a layer of hard mask material and a layer of photoresist on a second layer of hard mask material.

FIG. 1A shows a partially completed semiconductor device 100. The partially completed semiconductor device 100 is formed in a semiconductor substrate on and in which active devices (not shown) are formed. The substrate and active devices are indicated generally at 102 and will not be discussed further since the methods of forming active devices in and on a semiconductor substrate are well known in the semiconductor manufacturing art and such methods of formation are not part of the present invention. Shown in the substrate are two structures 104 and 106 that are formed to connect electrodes of active devices formed in the substrate 102 to other structures in layers formed above the substrate 102. The two structures 104 and 106 are surrounded by a dielectric material 108 that isolates the metal structures 104 and 106. The two structures 104 and 106 are typically formed from a conductive material such as aluminum, tungsten, copper or doped polysilicon. The dielectric material is typically silicon dioxide ($SiO_2$).

A first layer 110 of interlayer dielectric is formed on the surface of the layer 102 which has been planarized to provide a smooth flat surface on which to form subsequent layers. The first layer 110 of interlayer dielectric is formed from a high dielectric constant material such as silicon dioxide ($SiO_2$). A first layer 112 of etch stop material is formed on the surface of the first layer of interlayer dielectric 110. The first layer 112 of etch stop material is typically formed from a material such as silicon nitride ($Si_xN_y$) or silicon oxynitride (SiON). A second layer 114 of interlayer dielectric is formed on the surface of the first layer 112 of etch stop material. The second layer 114 of interlayer dielectric is typically approximately twice the thickness of the first layer 110 of interlayer dielectric. The second layer 114 of interlayer dielectric is typically formed from a high dielectric constant material such as silicon dioxide ($SiO_2$). A second layer 116 of etch stop material is formed on the surface of the second layer of interlayer dielectric 114. The second layer 116 of etch stop material is typically formed from a material such as silicon nitride ($Si_xN_y$) and silicon oxynitride (SiON). A first layer 118 of photoresist is formed on the surface of the second layer 116 of etch stop material.

Figure 1B:
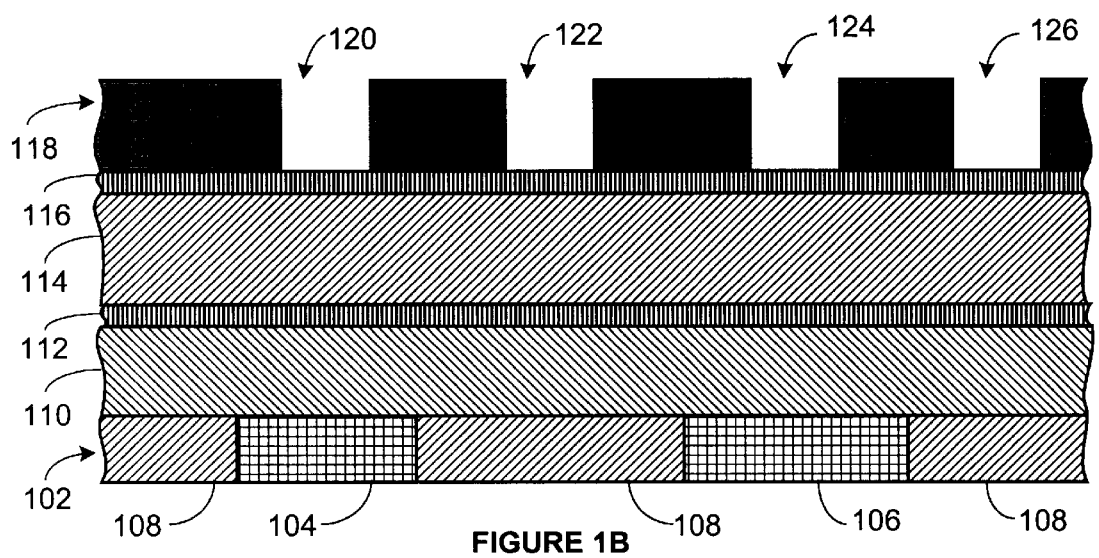
FIG. 1B shows the partially completed semiconductor device shown in FIG. 1A with the layer of photoresist patterned and etched to expose portions of the second layer of hard mask material underlying the layer of photoresist.

FIG. 1B shows the partially completed semiconductor device 100 as shown in FIG. 1A with the first layer 118 of photoresist patterned and etched to form openings 120, 122, 124 and 126 that expose portions of the second layer 116 of etch stop material.

Figure 1C:
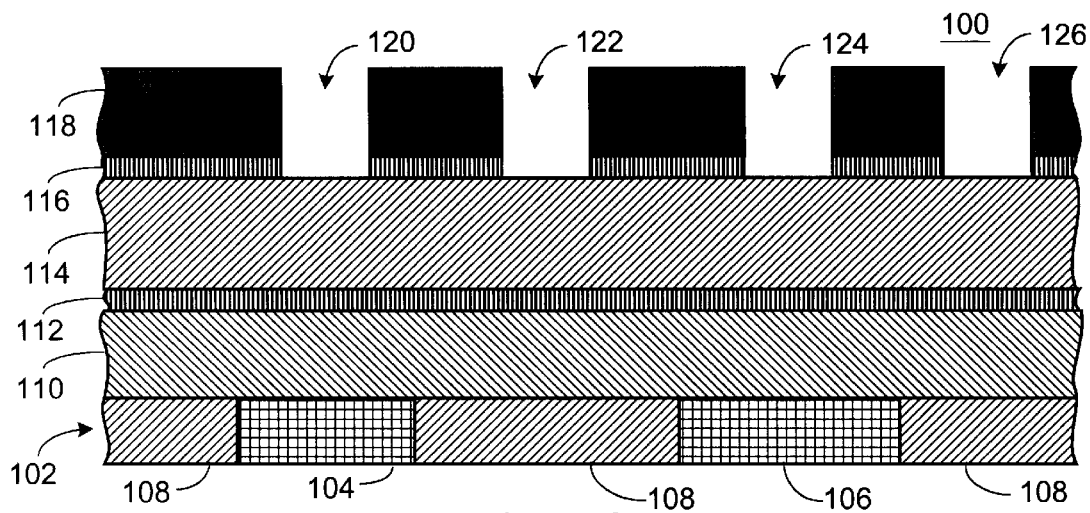
FIG. 1C shows the partially completed semiconductor device shown in FIG. 1B with the exposed portions of the second layer of hard mask material etched exposing portions of the top layer of interlayer dielectric.

FIG. 1C shows the partially completed semiconductor device 100 as shown in FIG. 1B after an anisotropic etch process to remove the exposed portions of the second layer 116 of etch stop material. The removal of the exposed portions of the second layer 116 of etch stop material exposes portions of the second layer 114 of interlayer dielectric.

Figure 1D:
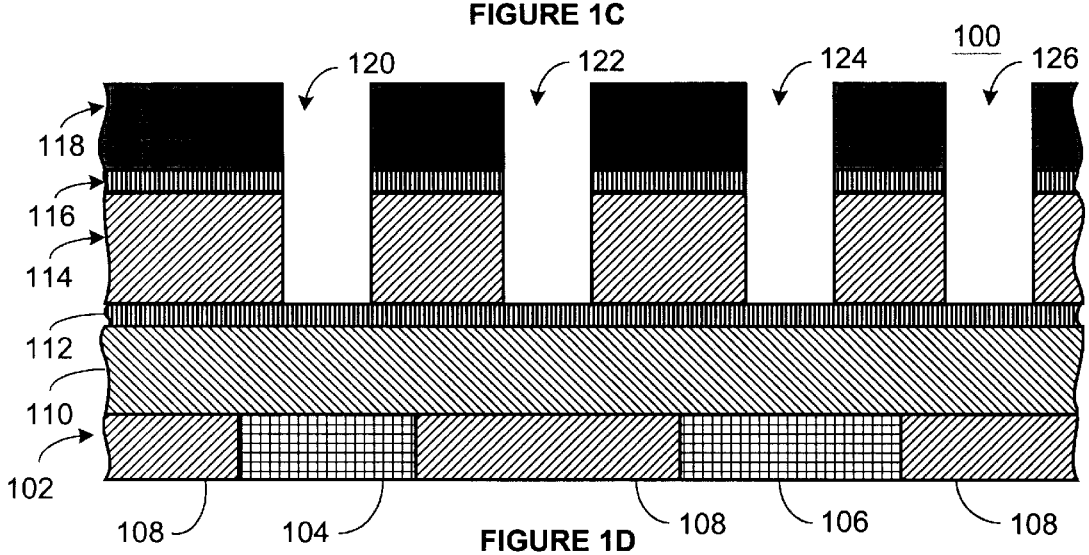
FIG. 1D shows the partially completed semiconductor device shown in FIG. 1C with the exposed portions of the top layer of interlayer dielectric etched exposing portions of the hard mask between the top layer and bottom layer of interlayer dielectric.

FIG. 1D shows the partially completed semiconductor device 100 as shown in FIG. 1C after an anisotropic etch process to remove the exposed portions of the second layer 114 of interlayer dielectric. The removal of the exposed portions of the second layer 114 of interlayer dielectric exposes portions of the first layer 112 of etch stop material.

Figure 1E:
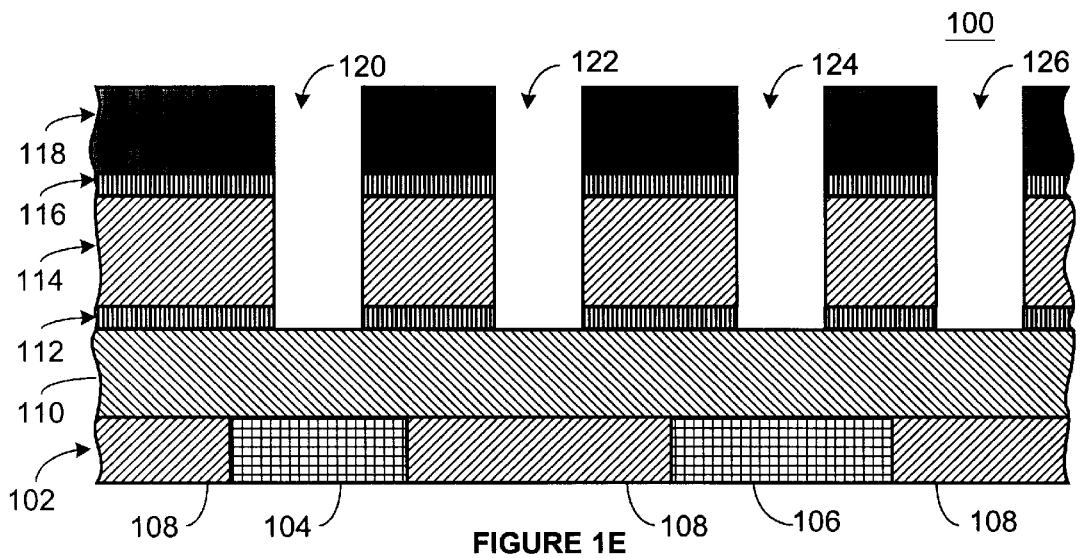
FIG. 1E shows the partially completed semiconductor device shown in FIG. 1D with the exposed portions of the hard mask between the top layer and bottom layer of interlayer dielectric etched exposing portions of the bottom layer of interlayer dielectric.

FIG. 1E shows the partially completed semiconductor device 100 as shown in FIG. 1D after an anisotropic etch process to remove the exposed portions of the second layer 112 of etch stop material. The removal of the exposed portions of the second layer 112 of etch stop material exposes portions of the first layer 110 of interlayer dielectric.

Figure 1F:
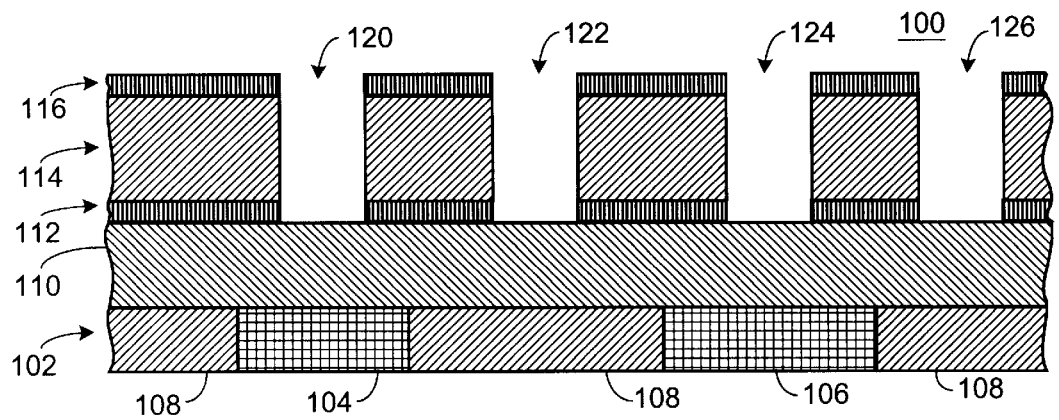
FIG. 1F shows the partially completed semiconductor device shown in FIG. 1E with the remaining portions of the layer of photoresist removed.

FIG. 1F shows the partially completed semiconductor device 100 as shown in FIG. 1E with the remaining portions of the first layer 118 removed.

Figure 1G:
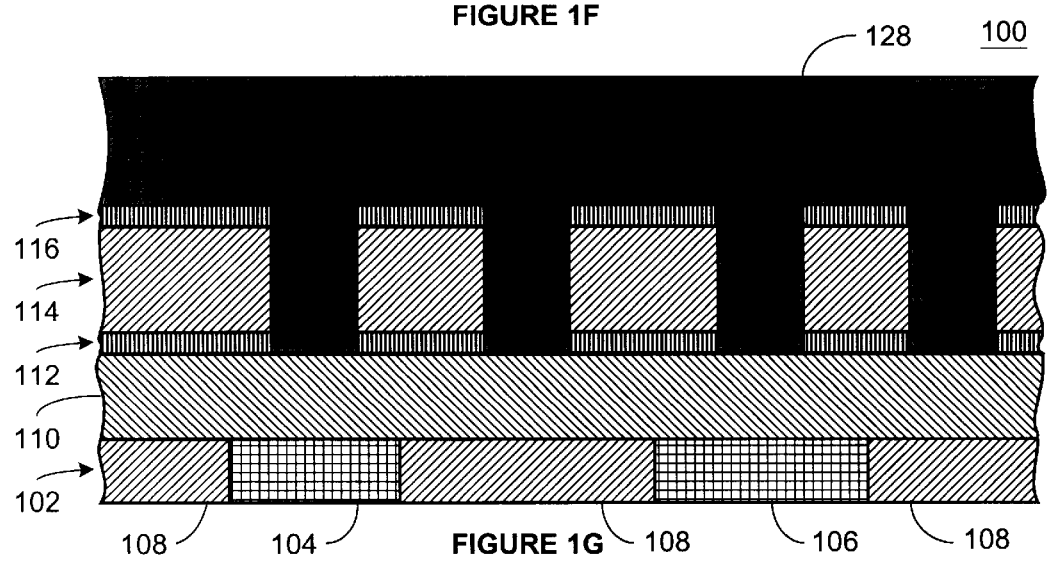
FIG. 1G shows the partially completed semiconductor device shown in FIG. 1F with a second layer of photoresist formed on the surface of the partially completed semiconductor device.

FIG. 1G shows the partially completed semiconductor device 100 as shown in FIG. 1F with a second layer 128 of photoresist applied to the surface of the partially completed semiconductor device 100.

Figure 1H:
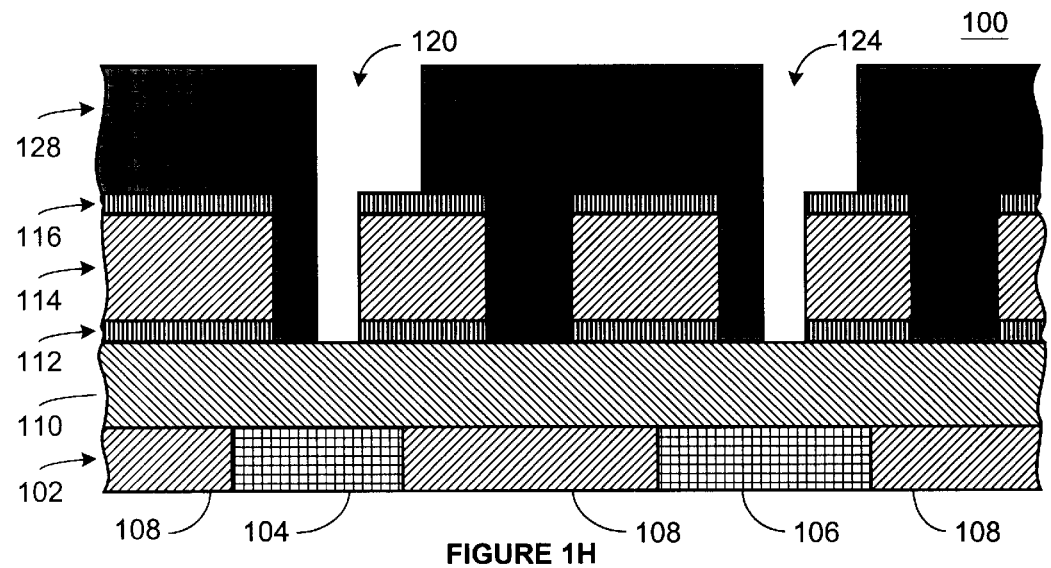
FIG. 1H shows the partially completed semiconductor device shown in FIG. 1G with the second layer of photoresist patterned and etched to expose selected portions of the top layer of hard mask material and to expose selected portions of the bottom layer of interlayer dielectric.

FIG. 1H shows the partially completed semiconductor device 100 as shown in FIG. 1G after the second layer 128 of photoresist has been patterned and etched to expose portions of the first layer 110 of interlayer dielectric. It is to be noted that the portions of the first layer 110 that are exposed are over the structures 104 and 106.

Figure 1I:
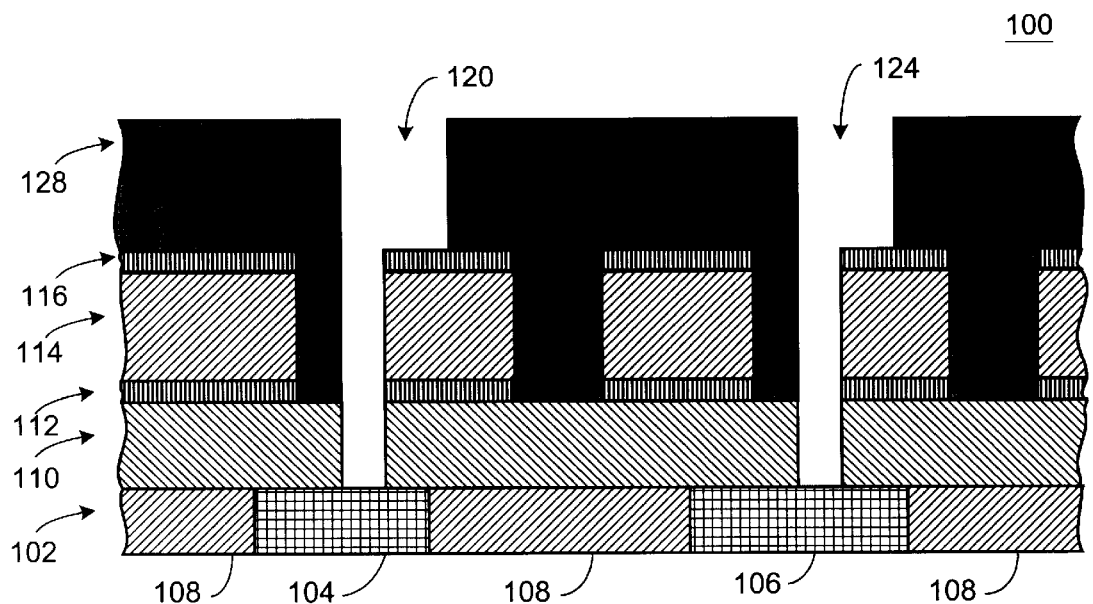
FIG. 1I shows the partially completed semiconductor device shown in FIG. 1H with the exposed portions of the bottom layer of interlayer dielectric exposing the two metal structures in the substrate structure.

FIG. 1I shows the partially completed semiconductor device 100 as shown in FIG. 1H after an anisotropic etch process that removes the exposed portions of the first layer 110 of interlayer dielectric. The removal of the exposed portions of the first layer 110 of dielectric exposes portions of the structures 104 and 106 in the layer 102.

Figure 1J:
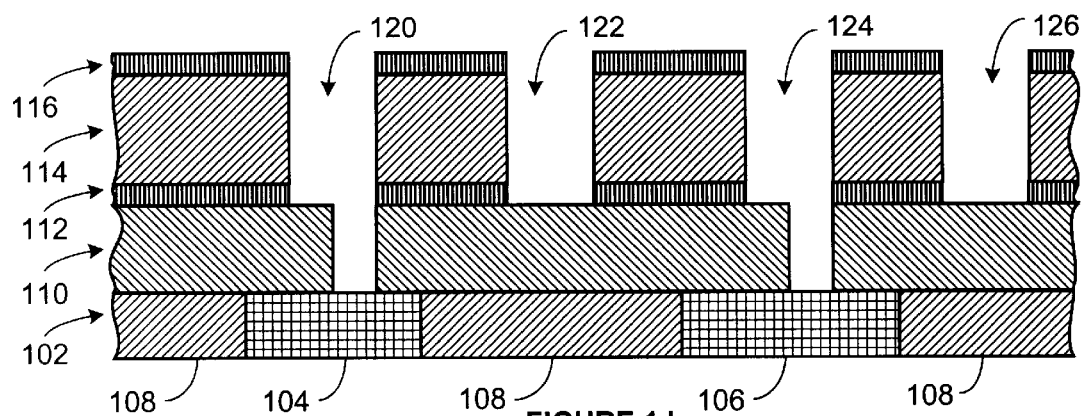
FIG. 1J shows the partially completed semiconductor device shown in FIG. 1I with the remaining portions of the second layer of photoresist removed.

FIG. 1J shows the partially completed semiconductor device 100 as shown in FIG. 1H with the remaining portions of the second layer 128 of photoresist removed.

Figure 1K:
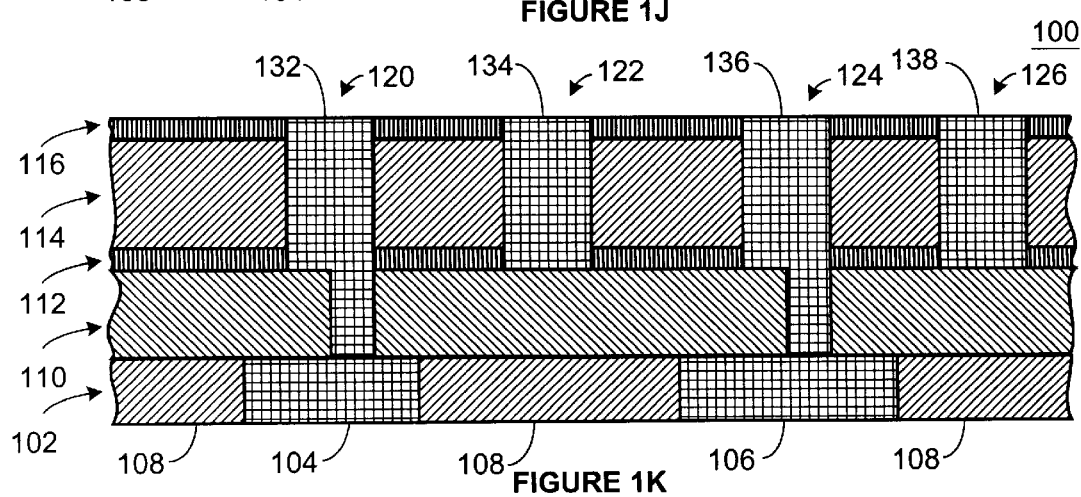
FIG. 1K shows the partially completed semiconductor device shown in FIG. 1J with the etched portions of the partially completed semiconductor device filled with a conductive material.

FIG. 1K shows the partially completed semiconductor device 100 as shown in FIG. 1J with the openings 120, 122, 124 and 126 filled with a conductive material. The conductive structure 132 that is formed in the opening 120 forms an electrical connection from structure 104 to a level above the second layer 114 of interlayer dielectric. It should also be noted that part of the structure 132 in the opening 120 might be a wire having a dimension into or out of the plane of the paper. The conductive structure formed in the opening 122 is a wire 134 in the second layer 114 of interlayer dielectric. As is known in the semiconductor manufacturing art the wire 134 may have a dimension into or out of the plane of the drawing or both. The conductive structure 136 formed in opening 124 is similar to the structure 132 formed in opening 120 and forms an electrical connection from structure 106 to a level above the second layer 114 of interlayer dielectric. Also, it should be noted that a part of the structure 136 formed in opening 124 might be a wire having a dimension into or out of the plane of the paper. The conductive structure formed in the opening 126 is a wire 138 in the second layer of 114 of interlayer dielectric. Similar to the wire 132 formed in the opening 122, the wire 138 might have a dimension either into or out of the plane of the drawing or both into or out of the plane of the drawing. The method of filing the openings 120, 122, 124 and 126 in the semiconductor structure are well known in the manufacturing art and include forming a layer of the conductive structure on the surface of the semiconductor structure and flowing the conductive material into the openings 120, 122, 124 and 126. The next step is to planarize the surface of the conductive material by a chemical mechanical polishing process that removes the portions of the conductive material down to the surface of the second layer 116 of etch stop material. Alternatively, the planarization may remove the portion of the conductive material and the second layer 116 of etch stop down to the surface of the second layer 114 of interlayer dielectric.

Figure 1L:
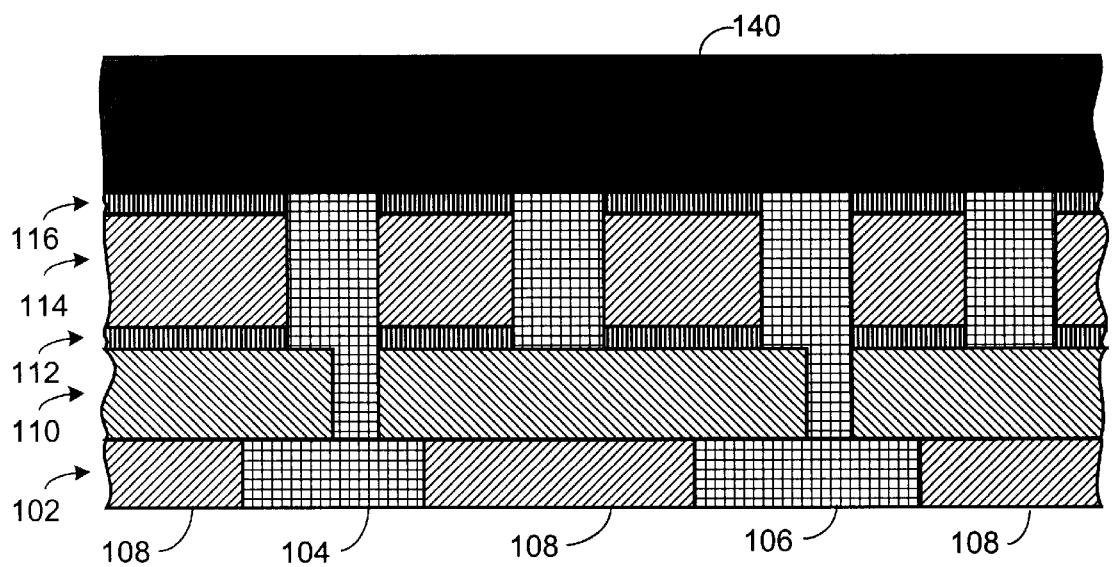
FIG. 1L shows the partially completed semiconductor device shown in FIG. 1K with a third layer of photoresist formed on the surface of the semiconductor device.

FIG. 1L shows the partially completed semiconductor device 100 as shown in FIG. 1K with a third layer 140 of photoresist formed on the surface of the partially completed semiconductor device 100.

Figure 1M:
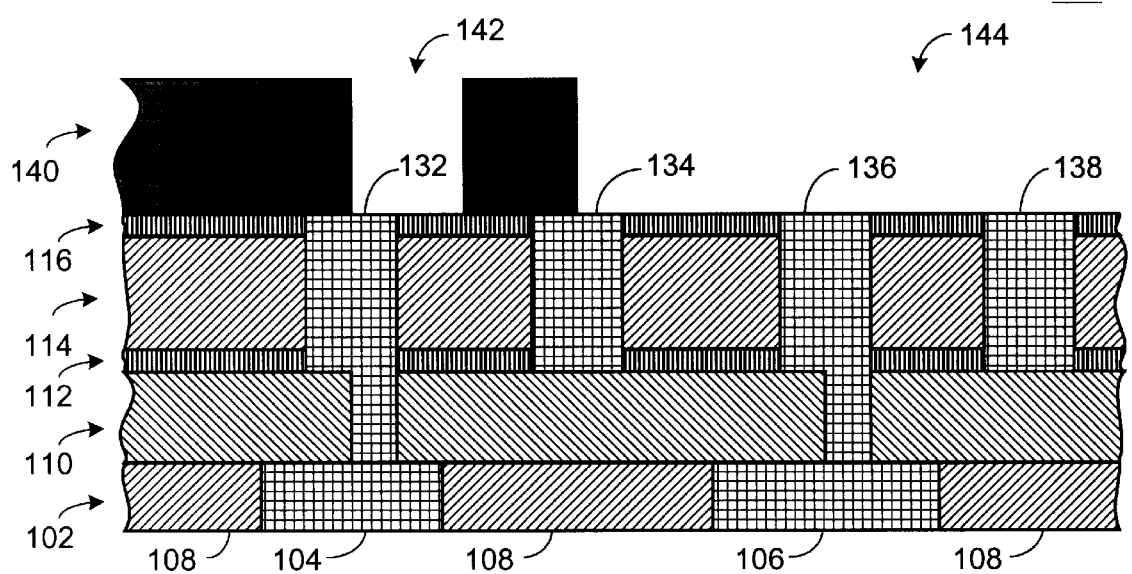
FIG. 1M shows the partially completed semiconductor device shown in FIG. 1L with the third layer of photoresist patterned and etched exposing portions of the surface of the semiconductor devices.

FIG. 1M shows the partially completed semiconductor device 100 as shown in FIG. 1L after the third layer 140 of photoresist has been patterned and etched. The third layer 140 of photoresist is etched to have openings at 142 and 144.

Figure 1N:
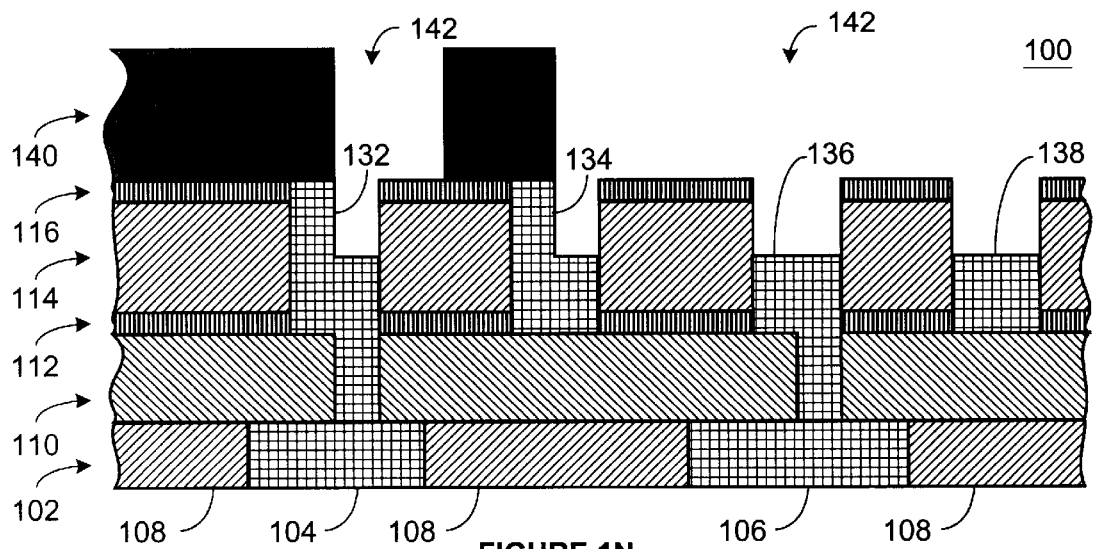
FIG. 1N shows the partially completed semiconductor device shown in FIG. 1M with exposed portions of the conductive material etched.

FIG. 1N shows the partially completed semiconductor device 100 as shown in FIG. 1M after an etch process to remove exposed portions of the conductive material in structures 132, 134, 136 and 138. The removal of the exposed portions of the conductive material in structures 132, 134, 136 and 138 results in openings 146, 148, 150 and 152.

Figure 1O:
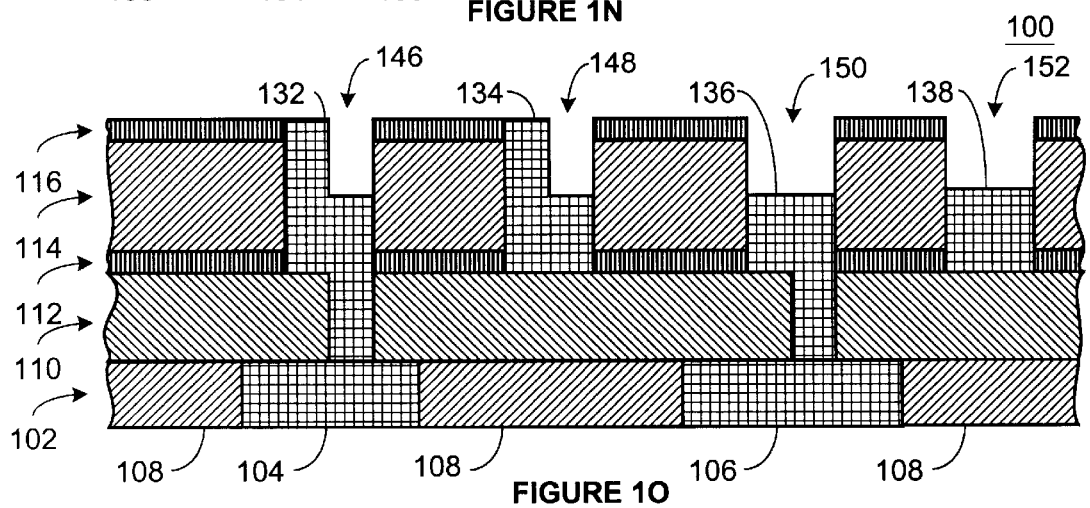
FIG. 1O shows the partially completed semiconductor device shown in FIG. 1N with the remaining portions of the third layer of photoresist removed.

FIG. 1O shows the partially completed semiconductor device 100 as shown in FIG. 1N with the remaining portions of the third layer 140 removed.

Figure 1P:
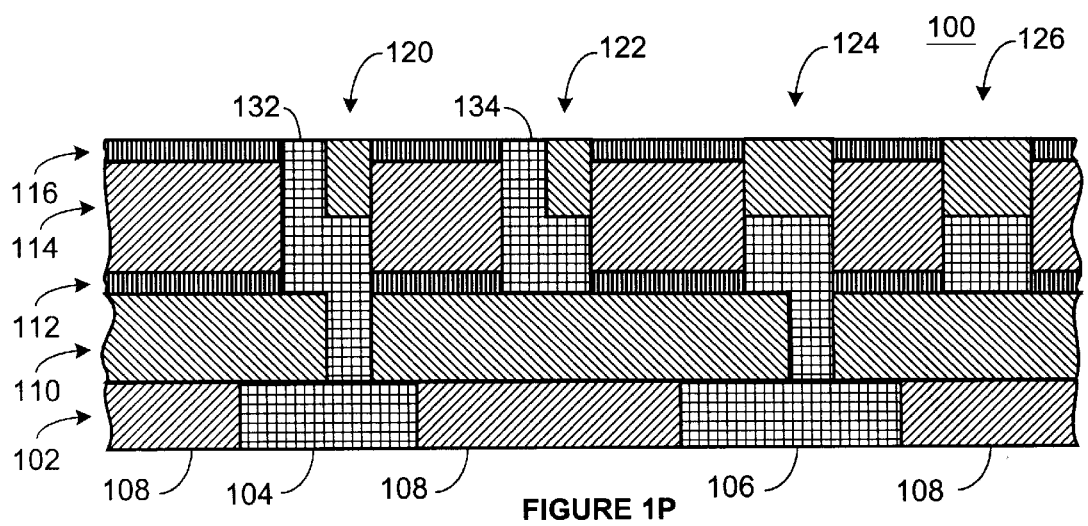
FIG. 1P shows the partially completed semiconductor device shown in FIG. 1O with the etched portions of the conductive material filled with an interlayer dielectric.

FIG. 1P shows the partially completed semiconductor device 100 as shown in FIG. 1P with openings 146, 148, 150 and 152 filled with a dielectric material. The top portion of the structure 132 formed in opening 120 is a via that will be connected to a conductive structure to be formed above the layer 116 of etch stop material. The top portion of the structure 134 is also a via that will be connected to a conductive structure to be formed above the layer 116 of etch stop material. The dielectric material formed on top of the conductive structure formed in opening 124 insulates the conductive material formed in the opening 124 from layers above the layer 116 of etch stop material. Similarly, the dielectric material formed on top of the conductive structure formed in opening 126 insulates the conductive material formed in the opening 126 from layers above the layer 116 of etch stop material. The surface of the semiconductor device 100 is planarized.

In summary, the results and advantages of the method of the present invention can now be more fully realized. The described method provides an improved method of manufacturing a semiconductor device having multiple layers of interconnect wherein the interconnect structures can be filled in a single step. The interconnect structures can be a combination of a via and a wire or simply a wire. In addition, the interconnect structure can be a wire with a via formed to the next higher level.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

forming a first layer of interlayer dielectric on a surface of a semiconductor substrate that contains at least one active semiconductor device and at least one conductive structure with a first end contacting an electrode of the at least one active semiconductor device;

forming a first layer of an etch stop material on the first layer of interlayer dielectric;

forming a second layer of interlayer dielectric on the first layer of an etch stop material;

forming a second layer of an etch stop material on the second layer of interlayer dielectric;

forming a first layer of photoresist on the second layer of an etch stop material;

patterning and etching the first layer of photoresist exposing portions of the second layer of etch stop material;

anisotropically etching the exposed portions of the second layer of etch stop material, wherein portions of the second layer of interlayer dielectric are exposed;

anisotropically etching the exposed portions of the second layer of interlayer dielectric, wherein portions of the first layer of etch stop material are exposed;

anisotropically etching the exposed portions of the first layer of etch stop material, wherein portions of the first layer of interlayer dielectric are exposed;

removing remaining portions of the first layer of photoresist;

forming a second layer of photoresist on a surface of the semiconductor device;

patterning and etching the second layer of photoresist exposing portions of the first interlayer dielectric overlaying the at least one conductive structure;

anisotropically etching the exposed portions of the first interlayer dielectric overlaying the at least one conductive structure, wherein portions of the at least one conductive structure are exposed;

removing the second layer of photoresist;

filling the etched portions of the semiconductor device with a conductive material;

planarizing the semiconductor device forming a planarized surface;

forming a third layer of photoresist on the planarized surface;

patterning and etching the third layer of photoresist exposing portions of the planarized surface of the semiconductor device;

anisotropically etching exposed portions of the conductive material;

removing the third layer of photoresist; and filling etched portions of the conductive material with a dielectric material.

2. The method of claim 1 further comprising planarizing the surface of the semiconductor device.

* * * * *